US006936840B2

(12) United States Patent
Sun et al.

(10) Patent No.: US 6,936,840 B2
(45) Date of Patent: Aug. 30, 2005

(54) PHASE-CHANGE MEMORY CELL AND METHOD OF FABRICATING THE PHASE-CHANGE MEMORY CELL

(75) Inventors: Jonathan Zanhong Sun, Shrub Oak, NY (US); Simone Raoux, Santa Clara, CA (US); Hemantha Wichramasinghe, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/766,936

(22) Filed: Jan. 30, 2004

(65) Prior Publication Data

US 2005/0167656 A1    Aug. 4, 2005

(51) Int. Cl.⁷ .................. H01L 29/06; H01L 39/00; H01L 27/095; H01L 29/47; H01L 29/812
(52) U.S. Cl. .......................... 257/30; 257/485
(58) Field of Search ................... 257/30, 485, 486

(56) References Cited

U.S. PATENT DOCUMENTS

| 5,217,916 A | * | 6/1993 | Anderson et al. ............ 438/128 |
| 5,536,947 A | | 7/1996 | Klersy et al. |
| 5,687,112 A | | 11/1997 | Ovshinsky |
| 6,087,674 A | | 7/2000 | Ovshinsky et al. |
| 6,287,919 B1 | | 9/2001 | Zahorik |
| 6,316,784 B1 | | 11/2001 | Zahorik et al. |
| 6,507,061 B1 | | 1/2003 | Hudgens et al. |
| 6,674,115 B2 | | 1/2004 | Hudgens et al. |
| 2002/0187260 A1 | * | 12/2002 | Sheppard et al. ........ 427/248.1 |

* cited by examiner

*Primary Examiner*—Ngân V. Ngô
(74) *Attorney, Agent, or Firm*—Stephen C. Kaufman, Esq.; McGinn & Gibb, PLLC

(57) ABSTRACT

A memory cell and method of fabricating the memory cell includes an insulating layer formed on a first electrode layer, the insulating layer having a first opening, a stencil layer formed on the insulating layer, and having a second opening formed in an area of the first opening, a phase-change material layer formed on a surface of the first electrode layer in the first opening, and an electrically conductive layer including a first portion formed on the stencil layer and defining a second electrode layer and a second portion formed on the phase-change material layer.

15 Claims, 8 Drawing Sheets

PHASE-CHANGE MEMORY CELL AND METHOD OF FABRICATING THE PHASE-CHANGE MEMORY CELL

BACKGROUND OF THE INVENTION

1. Field of the Invention

The present invention relates to a phase-change memory cell and a method of fabricating the memory cell and, more particularly, to a phase-change memory cell and a method of fabricating the memory cell in which a stencil layer is used to form a phase-change material layer.

2. Description of the Related Art

Nonvolatile memory elements based on the phase-change properties of the chalcogenide materials has a long history dating back to the '70s. Most known implementations of chalcogenide-based random access memory cells use the chalcogenide element both for read-out (based on its resistance change between the crystalline and amorphous state) and for write (based on Joule heating when current is passed through the chalcogenide).

The resistivity of chalcogenide can vary over a very wide range from nearly insulating to fairly conducting. This could sometimes be useful during film deposition to create a different initial resistive state of the chalcogenide material formed from the subsequent cyclable states used for memory operatoin, so as to encourage the formation of high-current density filamentary conduction paths within the memory element for better time-response. In such cases often a "break-in" procedure is necessary for each chalcogenide cell to condition it such that it is stable for repeated current-induction of thermal cycling between the crystalline and amorphous states This procedure, plus the reliability problems associated with a large drive current passing through the chalcogenide for writing (large enough to cause a temperature swing of up to 600° C. locally involving current densities on the order of $10^6$ A/cm$^2$ through the chalcogenide), makes large-scale adoption of the phase-change mechanism for memory difficult.

These are two of the key issues facing the application of the chalcogenide-type of phase-change memories in mass-produced circuits. Specifically, the issues include reliability associated with large current density through the chalcogenide element, and the need to individually break-in each chalcogenide element for reproducible operation.

SUMMARY OF THE INVENTION

In view of the foregoing and other problems, disadvantages, and drawbacks of the aforementioned conventional memory cells and methods of fabricating memory cells, it is a purpose of the exemplary aspects of the present invention to provide a memory cell and method of fabricating the memory cell which may improve device yield and reliability, and (e.g., at the same time) eliminate the need to individually break-in each phase-change element for reproducible operation.

The present invention also provides an efficient method for forming nanometer-scale pillar structures for a wide variety of materials including but not limited to the phase-change memory materials such as $Ge_2Sb_2Te_5$ (or GST for short). The present invention includes a method which requires no subtractive etching of the phase-change materials (e.g., for the formation of the pillar structure), and hence can in principle be used for materials that are difficult to etch or for which no mature etching process has been developed, which could result in significant savings in development cost for the incorporation of new memory materials.

In a first exemplary aspect of the present invention, a memory cell includes an insulating layer formed on a first electrode layer, the insulating layer having an first opening, a stencil layer formed on the insulating layer, and having a second opening formed in an area of the first opening, at least one phase-change material layer (e.g. a plurality of phase-change materials and/or phase-change material layers) formed on a surface of the first electrode layer in the first opening, and an electrically conductive layer comprising a first portion formed on the stencil layer and defining a second electrode layer and a second portion formed on the phase-change material layer.

The second portion of the electrically conductive layer may form a pillar-like structure which surrounds a sidewall of the phase-change material layer. Further, a bottom of the phase-change material layer may be surrounded by the first electrode layer, and a remaining portion of the phase-change material layer may be surrounded by the pillar-shaped structure. In addition, a gap may be formed between a sidewall of the pillar-shaped structure and the insulating layer to thermally isolate the pillar-shaped structure.

The stencil layer may include any materials that allow a differential etch of the underlying insulator. For example, the stencil layer may include (but not limited to) one of platinum and germanium. The first electrode layer may include a first electrically conductive material and the electrically conductive layer may include a second electrically conductive material.

The insulating layer that separates the bottom and top electrode can be any insulator that allows for a differential etch against the stencil material and the surface of the bottom electrode. The insulator can be (but does not have to be limited to) $SiO_2$. In addition, the phase-change material layer may include a chalcogenide (e.g., $Ge_2Sb_2Te_5$).

In one exemplary embodiment, the first electrically conductive material and the second electrically conductive material may include different materials (e.g., combinations of materials), such that a Schottky barrier is formed at an interface of the pillar-shaped structure and the first electrode layer. A temperature change of the phase-change material layer may cause a change in a threshold voltage of the Schottky barrier. Thus, the change in the threshold voltage can be used to read out the phase of the phase-change material.

Further, the phase-change material layer may include a chalcogenide, and the second electrically conductive material may be less electrically resistive than an initial as-deposited amorphous phase of the chalcogenide.

In another exemplary aspect, the memory cell further includes a third electrically conductive material formed on the first electrode layer in the first opening, the phase-change material layer being formed on the third electrically conductive material, such that the phase-change material layer is surrounded by the second and third electrically conductive materials.

The second and third electrically conductive materials may include the same materials. The choice of materials is for them to have low thermal conductivity, relatively high electrical conductivity, and to be structurally and chemically compatible with both the phase-changing material such as GST and the surrounding environment. For example, these materials may include a solid solution of $Bi_2Te_3$ and $Sb_2Te_3$. Specifically, the solid solution may include $Bi_9Sb_{31}Te_{60}$.

In another exemplary aspect of the present invention, a method of fabricating a memory cell includes forming a first electrode layer using a first electrically conductive material, an insulating layer, and a stencil layer having an opening, in that order, on a substrate, etching the insulating layer through the opening in the stencil layer, to expose a surface of the first electrode layer, depositing a phase-change material layer through the opening in the stencil layer onto the surface of the first electrode layer, and depositing a second electrically conductive material to form a second electrode layer and a pillar-shaped structure through the opening on the phase-change material layer, using a spread-angle for deposition which is greater than the spread-angle for deposition for the phase-change material.

Etching the insulating layer may include undercut etching in which a portion of the insulating layer underneath the stencil layer is etched, such that an opening is formed in the insulating layer which has a larger diameter than the opening in the stencil layer.

The method may also include lithographically defining bottom and top electrodes from the first electrically conductive material and the second electrically conductive material, respectively.

Further, the second electrically conductive material may be deposited using a deposition beam having a spread-angle of deposition which is greater than the spread-angle of deposition for the phase-change material layer by using one of different deposition conditions, and different deposition techniques (e.g., sample rotation with an off-normal beam incidence) to form the phase-change material layer and the pillar shaped structure. In addition, the phase-change material layer may be deposited using a first directional beam, and the second electrically conductive material may be deposited using a second directional beam having a broader spread-angle for deposition than the first directional beam.

Further, the angle of deposition (e.g., in depositing the phase change material layer and/or the second electrically conductive layer) can be accomplished by using a change in beam characteristic (e.g., by a change in beam orientation), or it can be accomplished by a change in substrate orientation (e.g., by rotating the substrate at an angle with respect to the beam). Thus, it should be noted that the present invention is not constrained to only using beam profile change to accomplish an angle of deposition. For example, depositing the phase-change material layer may include one of evaporation and/or low-pressure channelized sputtering, and depositing the second electrically conductive material may include one of high-pressure sputtering and/or rotating beam deposition. Depositing the phase-change material layer may include directionally depositing the phase-change material layer, such that the phase-change material layer is deposited off-center from the opening in the stencil layer.

In another exemplary aspect, the method may further include depositing a third electrically conductive material through the opening in the stencil layer onto the first electrode layer, the phase-change material layer being formed on the third electrically conductive material, such that the phase-change material layer is surrounded by the second and third electrically conductive materials.

With its unique and novel features, the present invention provides a memory cell and method of fabricating the memory cell which may improve device yield and reliability, and (e.g., at the same time) eliminate the need to individually break-in each phase-change element for reproducible operation.

BRIEF DESCRIPTION OF THE DRAWINGS

The foregoing and other features, aspects and advantages will be better understood from the following detailed description of exemplary embodiments of the invention with reference to the drawings, in which.

DETAILED DESCRIPTION OF THE EMBODIMENTS OF THE INVENTION

Figure 1:
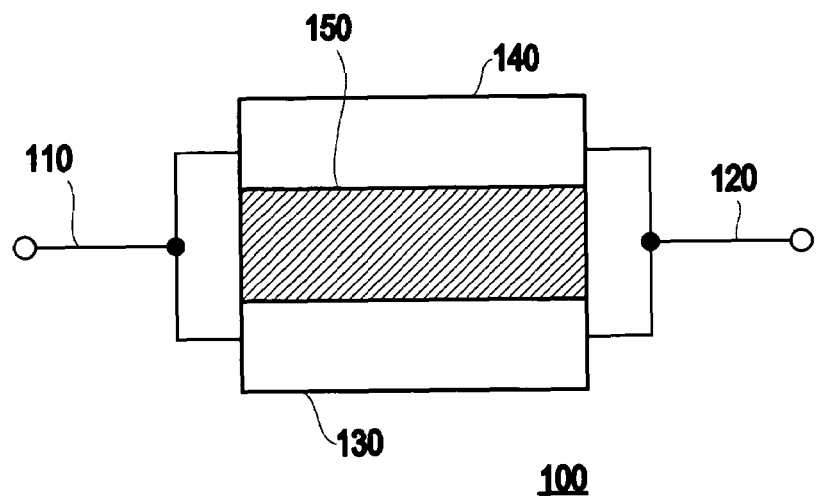
FIG. 1 illustrates a conceptual diagram of a memory cell 100 according to the present invention, in accordance with an exemplary aspect of the present invention.

Referring now to the drawings, FIG. 1 illustrates a conceptual diagram of a memory cell 100 according to the present invention, and FIGS. 2A–2D, 3A–3D, 4A–4D, 5A–5D and 6A–6D illustrate exemplary embodiments of methods of fabricating the memory cell, according to the exemplary aspects of the present invention.

In a first exemplary aspect of the present invention (e.g., illustrated in FIG. 2D), a memory cell includes an insulating layer 150 formed on a first electrode layer 120, the insulating layer having an first opening 155, a stencil layer 160 formed on the insulating layer, and having a second opening 165 formed in an area of the first opening 155, a phase-change material layer 140 formed on a surface of the first electrode layer 120 in the first opening 155, and an electrically conductive layer 130 comprising a first portion 130a formed on the stencil layer 160 and defining a second electrode layer and a second portion 130b (e.g., a pillar-shaped structure) formed on the phase-change material layer 140.

In the present invention, the phase change material (e.g., the as-deposited chalcogenide element) is usually in its virgin amorphous state and is electrically insulating (with a resistance higher than the subsequent resistive-high state used as a memory state). This makes it difficult to initiate the first heating cycle to bring the chalcogenide into its resistive-low state (or the subsequent resistive-high state that is lower than the virgin-state resistance and is more suitable for subsequent heating cycles).

Since the phase change material (e.g., the chalcogenide memory element) is electrically in parallel with the top electrode material, initial heating can be started by using current flowing in the top electrode (but in close thermal contact, and if necessary electrical contact, with the phase change material (e.g., chalcogenide)), accomplishing the initial amorphous to crystalline phase change which brings the phase change material (e.g., chalcogenide element) out of its virgin state.

The exemplary aspects of the present invention also include a method of fabricating a memory cell based on the properties of a phase-change material. Importantly, the method avoids the problems outlined above with respect to conventional methods.

The present invention may use a chalcogenide as a phase-change element, although the present invention is not intended to be limited to the use of a chalcogenide. It should be noted that as used herein, the term "chalcogenide" should be construed to mean any compound which includes a chalcogen (e.g., oxygen, sulfur, selenium and tellurium) and a more electropositive element or radical, which is suitable for use as a phase-change material in the memory cell according to the exemplary aspects of the present invention. One such suitable chalcogenide includes, for example, $Ge_2Sb_2Te_5$.

The phase-change material may further include material families outside of the chalcogenides. In its broadest conceptual sense it may be any material that has a bi-stable or multiple-stable resistive (and/or structural) state(s) that can be electrically (or thermally) selected. The memory cell may use any other materials that has bi-stable or multiple-stable resistive states that can be electrically selected. This may or may not have to be limited to state changes requiring a physical phase-change of the material.

An example of such memory material would be charge-trap-based organic molecules or compounds. The multiple-stable resistive states may further be realized by using a plurality of phase changing materials, stacked in the form of a multilayer, having different phase-change temperatures (e.g., each having a different phase transition temperature). The various layers of phase change material having different transition temperatures may further be separated by at least one non-phase-change layer (e.g., diffusion barrier layer) that could include an oxide or a nitride or some other material having a high-refractivity and a high melting point.

The present invention may use a separate conducting material to support the write-current and related power input, making the write process less dependent on the resistance change of the phase-change element (e.g., the chalcogenide element). The read-out in the present invention can be accomplished either by sensing the fractional change in junction resistance caused by the phase-change of the phase-change element, or by measuring the difference in thermal conductivity of the phase-change element caused by its phase-change.

Moreover, the method of fabricating the memory cell includes a nano-stencil based method that allows for self-aligned, scaling-friendly fabrication of the memory cell.

Operation of the memory cell may be better understood by considering the concept illustrated in FIG. 1. As illustrated in FIG. 1, a memory cell 100 according to an exemplary aspect of the present invention may include two parallel conduction paths (e.g., resistor 130 and phase-change element) 140. The memory cell 100 (e.g., two-terminal memory device) may also include two "terminals" 110, 120 which are in thermal and/or electrical contact.

The write current passes primarily through the resistor (e.g., heating element or sensing element) 130 which acts as a nano-heater. The resistor 130 is in good thermal contact with the phase-change element 140, providing the latter with sufficient temperature swing to switch it between its crystalline and amorphous state, accomplishing the write function of the phase-change memory.

In addition, a region of thermal/electrical (e.g., thermal and/or electrical) coupling 150 is located beween the resistor 130 and the phase-change element 140. This region 150 may include a portion of the resistor 130, a portion of the phase-change element 140, and/or a material other than the resistor 130 and element 140.

The read function in the memory cell 100 can be accomplished in several ways. For example, one could choose the material of the resistor (e.g., heating or sensing element) 130 to be of large thermal-coefficient in its resistance, and allow for the phase-change element 140 to be in contact with a large area of the substrate which would act as a thermal sink.

A read operation in that case can be accomplished by driving the resistor (e.g., heating element) 130 with a time-varying current, and reading out the time-varying resistance associated with the heating/cooling cycle. A crystalline phase-change material would be thermally more conducting, resulting in a smaller temperature swing of the resistor (e.g., heating element) 130, and hence, a smaller resistance variation over time.

Secondly, similar to the above approach, one could use a Schottky diode interface between the resistor (e.g., heating element) 130 and its semiconductor base (such as at the interface between resistor (e.g., heating element) 130 and terminal 110 or 120), and use the highly temperature-sensitive Schottky voltage threshold as a way of reading out the temperature oscillation during a read-current drive.

Thirdly, one could choose the resistor (e.g., heating element) 130 such that its resistance is comparable to the low-resistance state of the phase-change element 140. By allowing an electrical coupling (e.g., a direct electrical contact) between the phase-change element 140 and the resistor (e.g., heating element) 130, the resistance change of the phase-change element 140 will be reflected in the total resistance between terminals 110 and 120. By sensing the low-current resistance state between terminals 110 and 120 (whether it is in its low-resistance state indicating the phase-change element 140 is in its crystalline or conducting phase, or whether it is in its high resistance state when the phase-change element is insulating or in its amorphous state), one can read out the memory status of the memory cell electrically.

Figure 7:
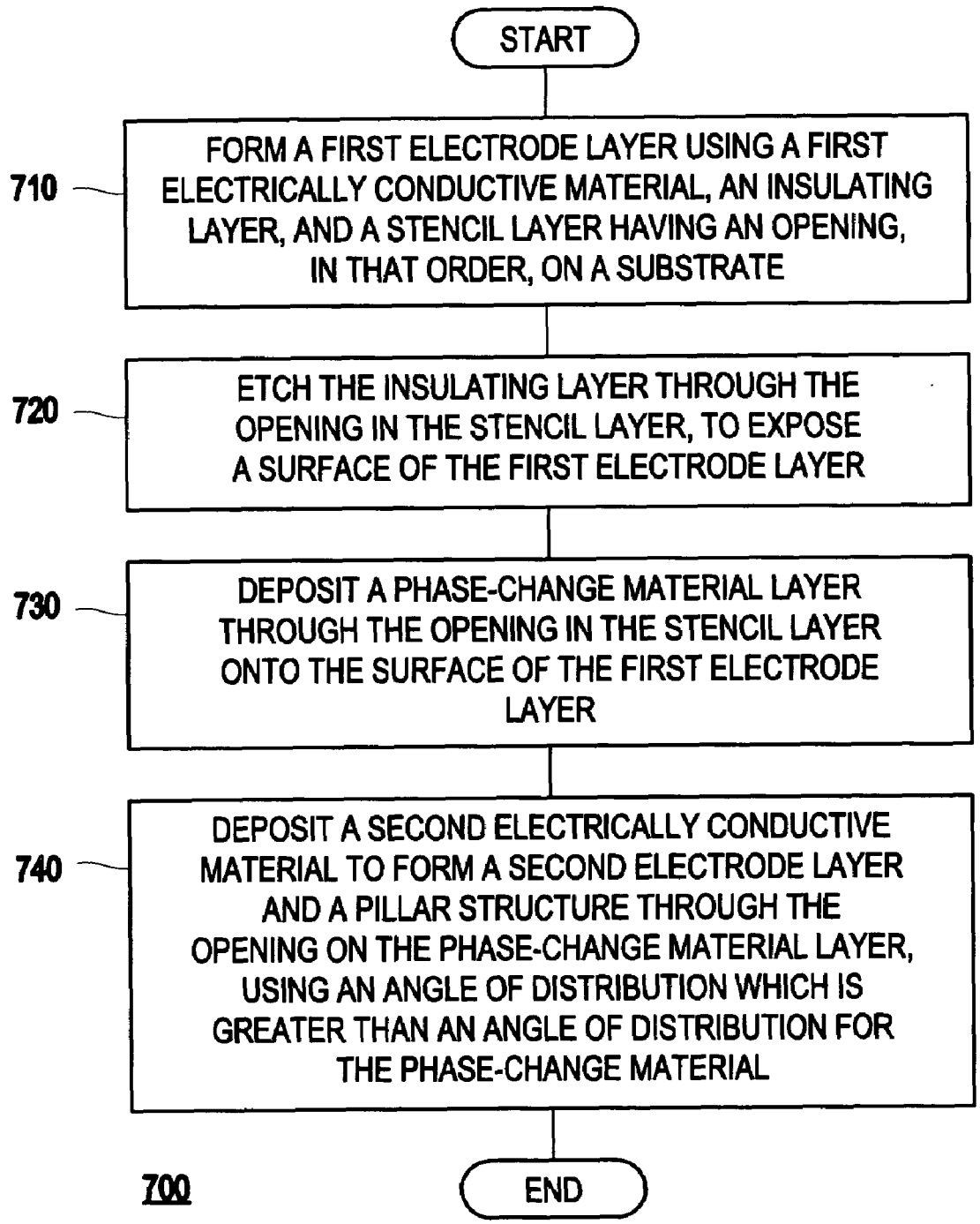
FIG. 7 illustrates a method 700 of fabricating a memory cell, in accordance with an exemplary aspect of the present invention.

Referring again to the drawings, FIG. 7 provides a flow chart illustrating a method 700 for fabricating a memory cell according to the exemplary aspects of the present invention. Specifically, the memory cell can be fabricated using a nano-stencil-based fabrication method developed by the present inventors (e.g., as described in IBM Disclosure No. YOR8-2001-043), which is incorporated by reference herein.

As illustrated in FIG. 7, the method 700 of fabricating a memory cell includes forming (710) a first electrode layer using a first electrically conductive material, an insulating layer, and a stencil layer having an opening, in that order, on a substrate, etching (720) the insulating layer through the opening in the stencil layer, to expose a surface of the first electrode layer, depositing (730) a phase-change material layer through the opening in the stencil layer onto the surface of the first electrode layer, and depositing (740) a second electrically conductive material to form a second electrode layer and a pillar-shaped structure through the opening on the phase-change material layer, using an spread-angle for deposition which is greater than the spread-angle for deposition for the phase-change material.

It should be noted that depositing (730) a phase-change material layer and depositing (740) a second electrically conductive material may be reversed and/or repeated in different orders so as to enclose the chalcogenide memory element inside the electrode materials, as will be discussed in the example in FIGS. 4A–4D.

FIGS. 2A–2D further illustrate the method 700 of fabricating a memory cell according to an exemplarly aspect of the present invention. Specifically, FIGS. 2A–2D illustrate a cross-sectional view of a memory cell being fabricated according to the exemplary aspects of the present invention.

Figure 2A:
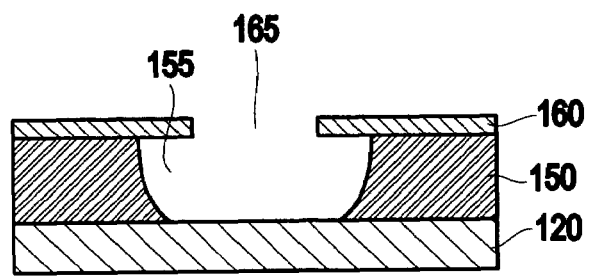
FIGS. 2A–2D provide a cross-sectional view of a memory cell structure, illustrating the method of fabricating a memory cell, in accordance with an exemplary aspect of the present invention.

As illustrated in FIG. 2A, on a substrate (e.g., a semiconductor substrate (not shown)), may be formed a first conductive (e.g., electrically conductive) layer (e.g., bottom conducting surface) 120, an insulator layer 150 (e.g., $SiO_2$), and a stencil layer 160. The insulator layer 150 is etched (e.g., undercut-etched) through an opening 165 in the stencil layer 160 to provide an open space below the stencil mask layer for self-aligned manipulation of the cell structure as discussed below.

Figure 2B:
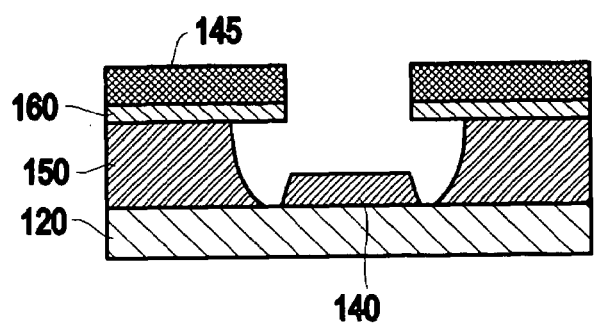

As illustrated in FIG. 2B, a phase-change material may be deposited to form the phase-change element 140 on the first conductive layer 120. For example, a line-of-sight deposition process (such as evaporation or low-pressure channelized sputtering) may be used to deposit the phase-change (e.g., chalcogenide) material. A portion (e.g., upper portion 145) of the phase-change material which is blocked by the stencil layer 160 from entering the opening 165 may remain on the stencil layer 160.

Figure 2C:
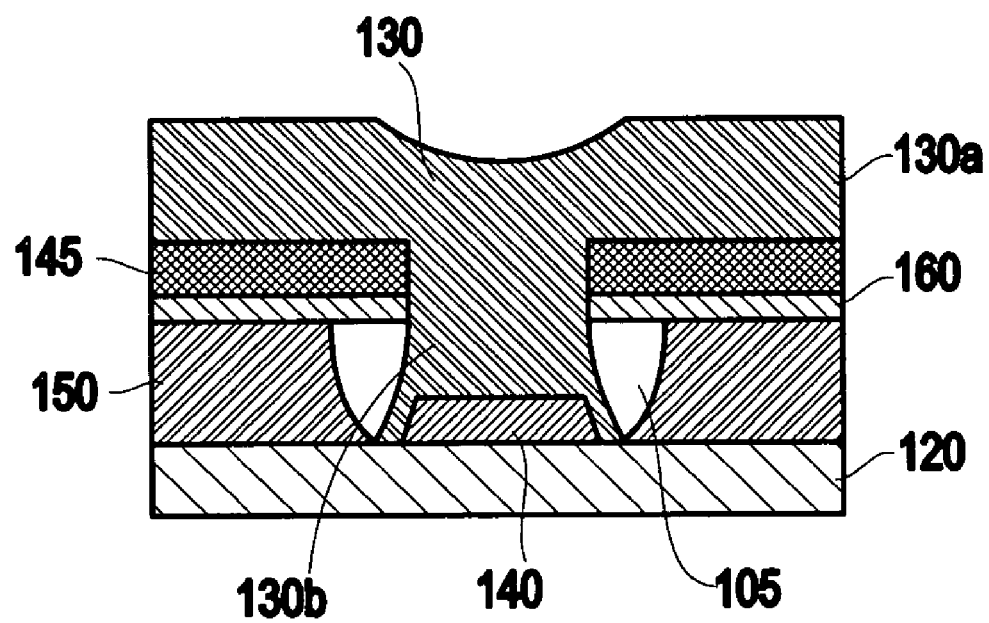
Figure 2D:
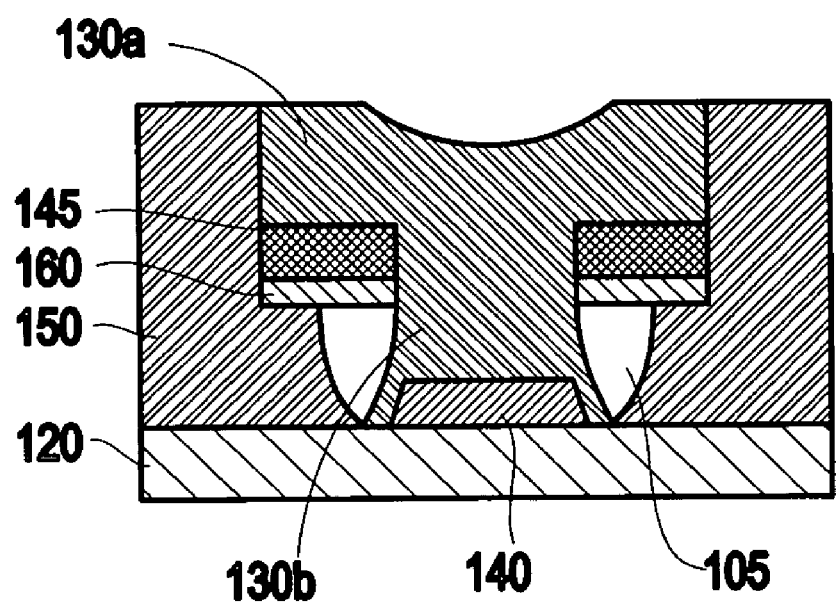

As illustrated in FIG. 2C, the structure may be closed by depositing a second conductive (e.g., electrically conductive) layer (e.g., a thick conducting metal layer) 130. A first portion 130a of this second conductive layer may be formed on the stencil layer 160 (e.g., on the portion of phase-change material which is deposited on the stencil layer 160) and define a second electrode layer. Another portion 130b of the second conductive layer 130 may be formed through the opening 165 of the stencil layer 160 onto the phase-change element 140 (e.g., and an adjacent area of the first conductive layer 120) and define a pillar-shaped structure.

Importantly, in the present invention an spread-angle for deposition for the pillar-shaped structure (e.g., second portion 130b) may be greater than an spread-angle for distribution for the phase-change element 140. Specifically, the layer 130 may be deposited using a diffused beam, such as high-pressure sputtering, or deposition with a rotating beam direction. The diffused beam deposition creates a pillar-shaped structure having a self-aligned thin crust of the layer 130 (e.g., top metal film) around the phase-change element 140 (e.g., chalcogenide island).

The crust of the pillar-shaped structure forms the parallel heating resistor as well as acts as a passivation/environmental protection layer for the phase-change element 140. Further, a gap 105 may be formed between a sidewall of the pillar-shaped structure and the insulator layer 150 to thermally isolate the pillar-shaped structure.

Figure 3A:
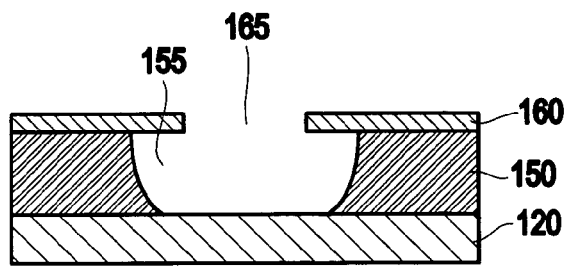
FIGS. 3A–3D provide a cross-sectional view of a memory cell structure, illustrating the method of fabricating a memory cell, in accordance with another exemplary aspect of the present invention.
Figure 3B:
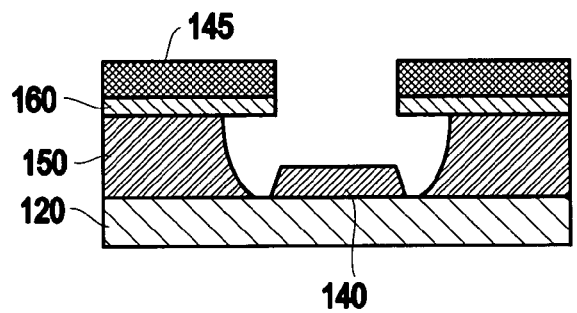
Figure 3C:
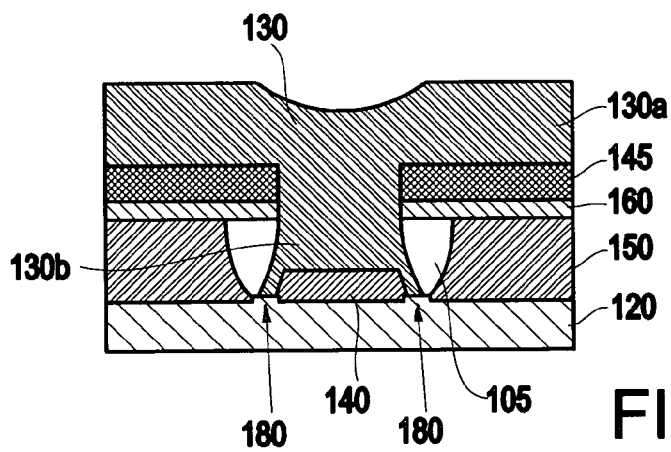
Figure 3D:
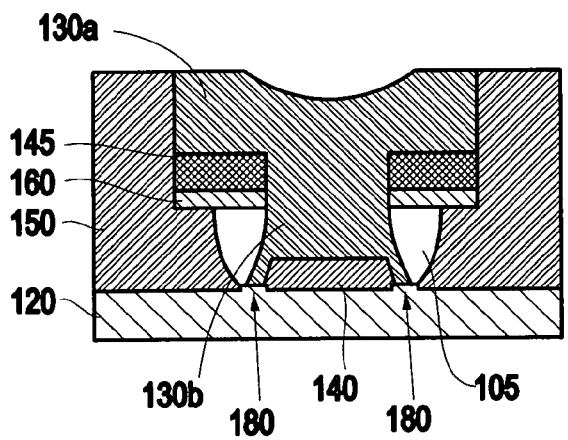

FIG. 3D illustrates the substantially completed memory cell according to this exemplary aspect of the present invention. As illustrated in FIG. 3D, after the second conductive layer 130 is formed, the structure (e.g., including the second conductive layer 130) may be patterned and the necessary contacts and leads can be formed, to fabricate the memory cell according to this exemplary aspect of the present invention.

It should be noted that the opening 165 in the stencil layer 160 may have a circular shape when the structure is viewed from a plan view. As a result, the layers formed through the opening 165 (e.g., the phase-change element 140 and the pillar-shaped structure (e.g., second portion 130b) may have a substantially-circular cross-section with viewed from a plan view. However, the shape of the opening 165 is not necessarily limited to any particular shape in the present invention.

FIGS. 3A–3D illustrate another aspect of the method 700 of fabricating a memory cell according to the exemplary aspects of the present invention. This aspect is similar to the aspect of FIGS. 2A–2D, and therefore, the discussion above with respect to FIGS. 2A–2D applies herein.

However, in addition, in this aspect of FIGS. 3A–3D, a Schottky barrier 180 is formed on the surface of the first conductive layer (e.g., bottom conductor) 120 where it interfaces with the second conductive layer (e.g., pillar-shaped structure). By doing so, the Schottky barrier 180 may act as a sensitive thermal sensor, reacting to the temperature change of the phase-change element 140 and surroundings by a change in its threshold voltage, allowing for a thermometry-based read-out, as discussed above.

FIGS. 4A–4D illustrate another aspect of the method 700 of fabricating a memory cell according to the exemplary aspects of the present invention. This aspect is also similar to the aspect of FIGS. 2A–2D, and therefore, the discussion above with respect to FIGS. 2A–2D applies herein.

However, in addition, in this aspect of FIGS. 4A–4D, an electrically conductive material (e.g., a third electrically conductive material) may be deposited using a diffused beam to form a third electrically conductive layer 190 on the first conductive layer 120 before the deposition (e.g., line-of-sight deposition) of the phase-change element 140. The layer 190 may include the same material as the second conductive layer 130 or different material from the second conductive layer 130. Further, a portion (e.g., upper portion 195) of the electrically conductive material which is blocked by the stencil layer 160 from entering the opening 165 may remain on the stencil layer 160.

Figure 4A:
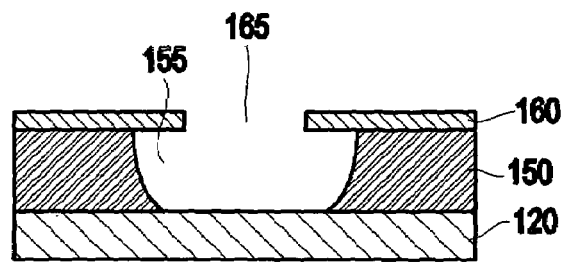
FIGS. 4A–4D provide a cross-sectional view of a memory cell structure, illustrating the method of fabricating a memory cell, in accordance with another exemplary aspect of the present invention.
Figure 4B:
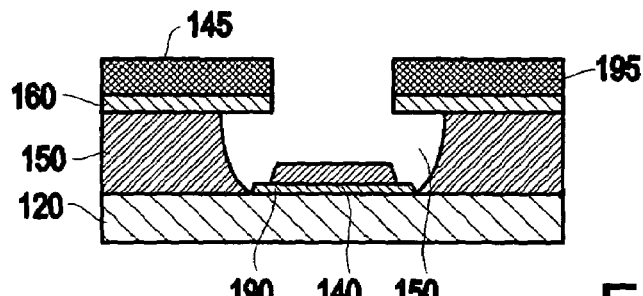

The phase-change element 140 may, therefore, be deposited on the third electrically conductive layer 190. In addition, as shown in FIG. 4B, the third electrically conductive layer 190 may have an spread-angle for deposition which is greater than that of the phase-change element 140, such that the third electrically conductive layer 190 covers a greater area of the surface of the first electrode layer 120 than the area covered by the phase-change element 140.

Figure 4C:
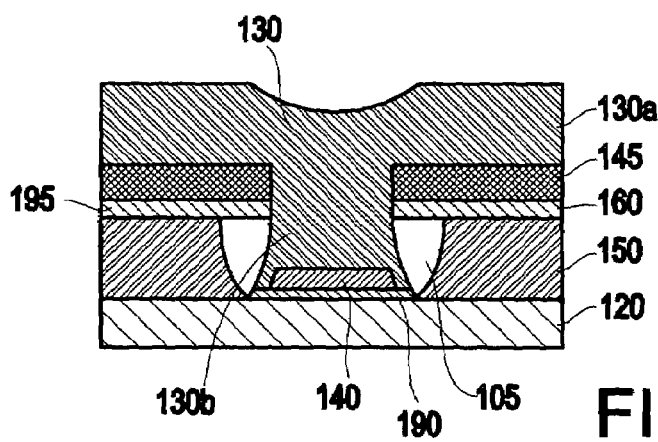
Figure 4D:
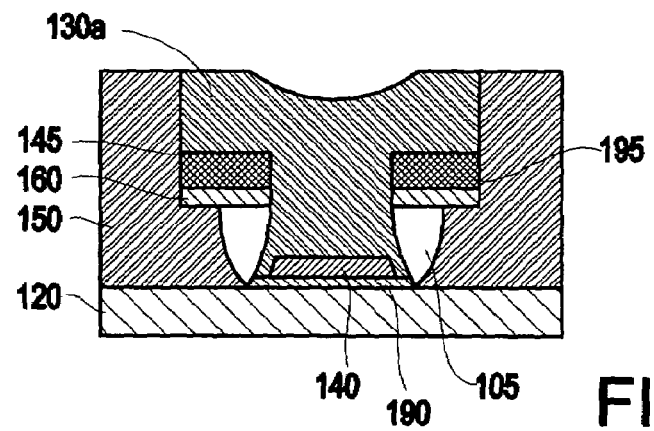

As illustrated in FIG. 4C, the second conductive material 130 (e.g., a thick layer of the top electrode material) may be deposited on the phase-change element 140 (e.g., and any exposed portion of the third electrically conductive layer 190) deposited using a diffused beam. As illustrated in FIG. 4C, the spread-angle for deposition for the second conductive material 130 should be greater than that of the phase-change element 140.

This way, the phase-change element 140 can be enclosed (e.g., completely enclosed) inside of electrically conductive material (e.g., the tip electrode material), providing good environmental isolation for the phase-change element 140. In addition, this aspect allows the phase-change element 140 to be raised to a higher level (e.g., a more optimal position) in the pillar-shaped structure for more efficient (e.g., optimal) heating of the phase change element 140. This aspect works especially well with a resistance-change based read-out scheme.

FIGS. 5A–5D illustrate another aspect of the method 700 of fabricating a memory cell according to the exemplary aspects of the present invention. This aspect is also similar to the aspect of FIGS. 2A–2D, and therefore, the discussion above with respect to FIGS. 2A–2D applies herein.

Figure 5A:
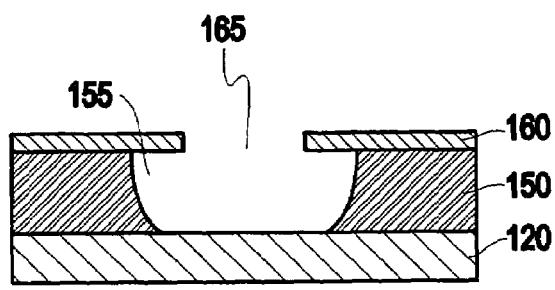
FIGS. 5A–5D provide a cross-sectional view of a memory cell structure, illustrating the method of fabricating a memory cell, in accordance with another exemplary aspect of the present invention.
Figure 5B:
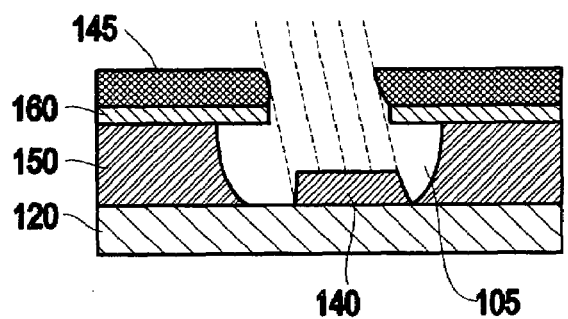
Figure 5C:
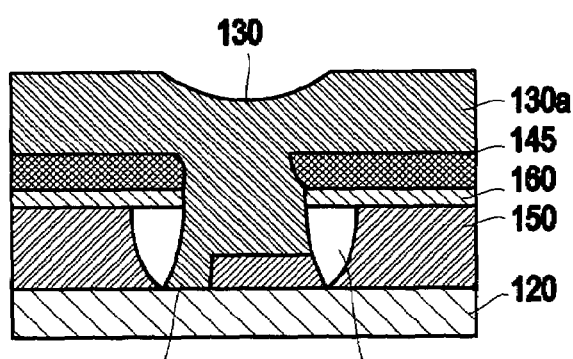
Figure 5D:
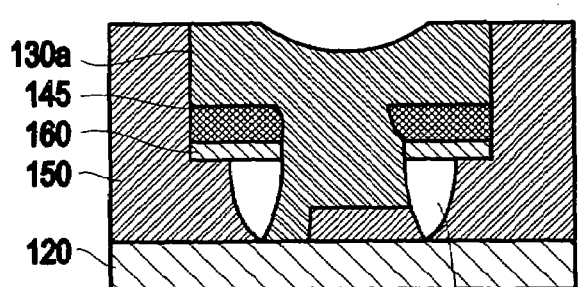
Figure 6A:
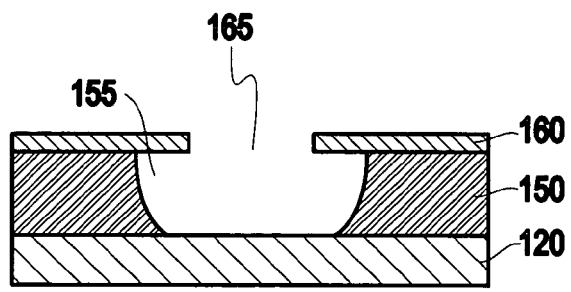
FIGS. 6A–6D provide a cross-sectional view of a memory cell structure, illustrating the method of fabricating a memory cell, in accordance with another exemplary aspect of the present invention.
Figure 6B:
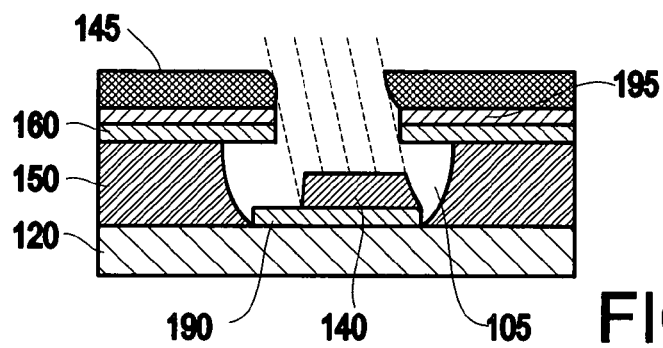
Figure 6C:
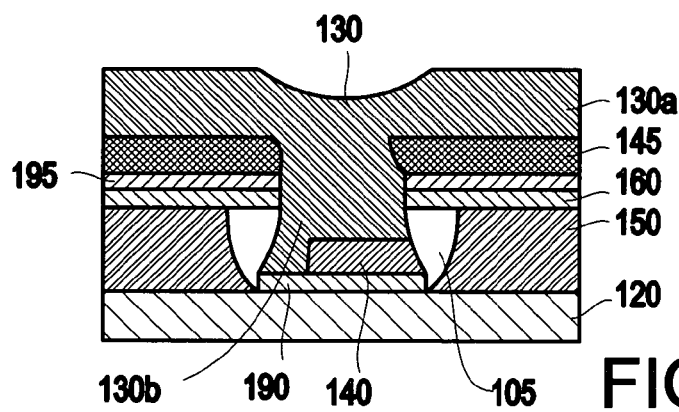
Figure 6D:
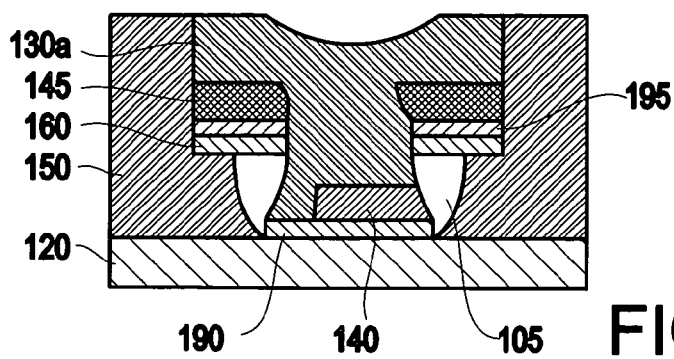

However, in addition, in this aspect of FIGS. 5A–5D, the phase-change element 140 may be intentionally deposited off-center. This may allow for more precise control of the area-overlapping the phase-change element 140 and the pillar-shaped structure (e.g., the top electrode material), making the over-all resistance (e.g., electrical resistance) of the memory cell structure less dependent on details of the beam characteristics of the diffused beam. For example, as illustrated in FIG. 5C, this aspect allows for the thickness of the second conductive material in the pillar-shaped structure surrounding the sides of the phase-change element 140 to be controlled, such that it may vary from one side of the phase-change element 140 to another side.

In addition, this aspect of the method could be used in combination with the process flows illustrated above with respect to FIGS. 2A–2D through FIGS. 4A–4D to achieve the same effect and advantages described therein and at the same time provide for improved control of the cross-sections of the second conductive material in the pillar-shaped structure (e.g., the top metal material) with respect to the phase-change element 140.

FIGS. 6A–6D illustrate another aspect of the method 700 of fabricating a memory cell according to the exemplary aspects of the present invention. This aspect is also similar to the aspect of FIGS. 2A–2D, FIGS. 4A–4D and FIGS. 5A–5D and, therefore, the discussion above with respect to FIGS. 2A–2D, FIGS. 4A–4D and FIGS. 5A–5D applies herein.

Specifically, similar to the aspect of FIGS. 4A–4D, an electrically conductive material (e.g., a third electrically conductive material) may be deposited using a diffused beam to form a third electrically conductive layer 190 on the first conductive layer 120 before the deposition (e.g., line-of-sight deposition) of the phase-change element 140. In addition, similar to the aspect of FIGS. 6A–6D, the phase-change element 140 may be intentionally deposited off-center. This may allow for more precise control of the area-overlapping the phase-change element 140 and the pillar-shaped structure (e.g., the top electrode material), making the over-all resistance (e.g., electrical resistance) of the memory cell structure less dependent on details of the beam characteristics of the diffused beam.

Therefore, this aspect can be used to both control the positioning of the phase-change element 140 and the cross-sectional area of the pillar-shaped structure (e.g., the heating element). As a result, this aspect may improve (e.g., optimize) the cell yield and/or stability and provide for improved (e.g., maximum) efficiency in terms of heating power delivery from the pillar-shaped structure (e.g., the write element) to the phase-change element 140.

Figure 8:
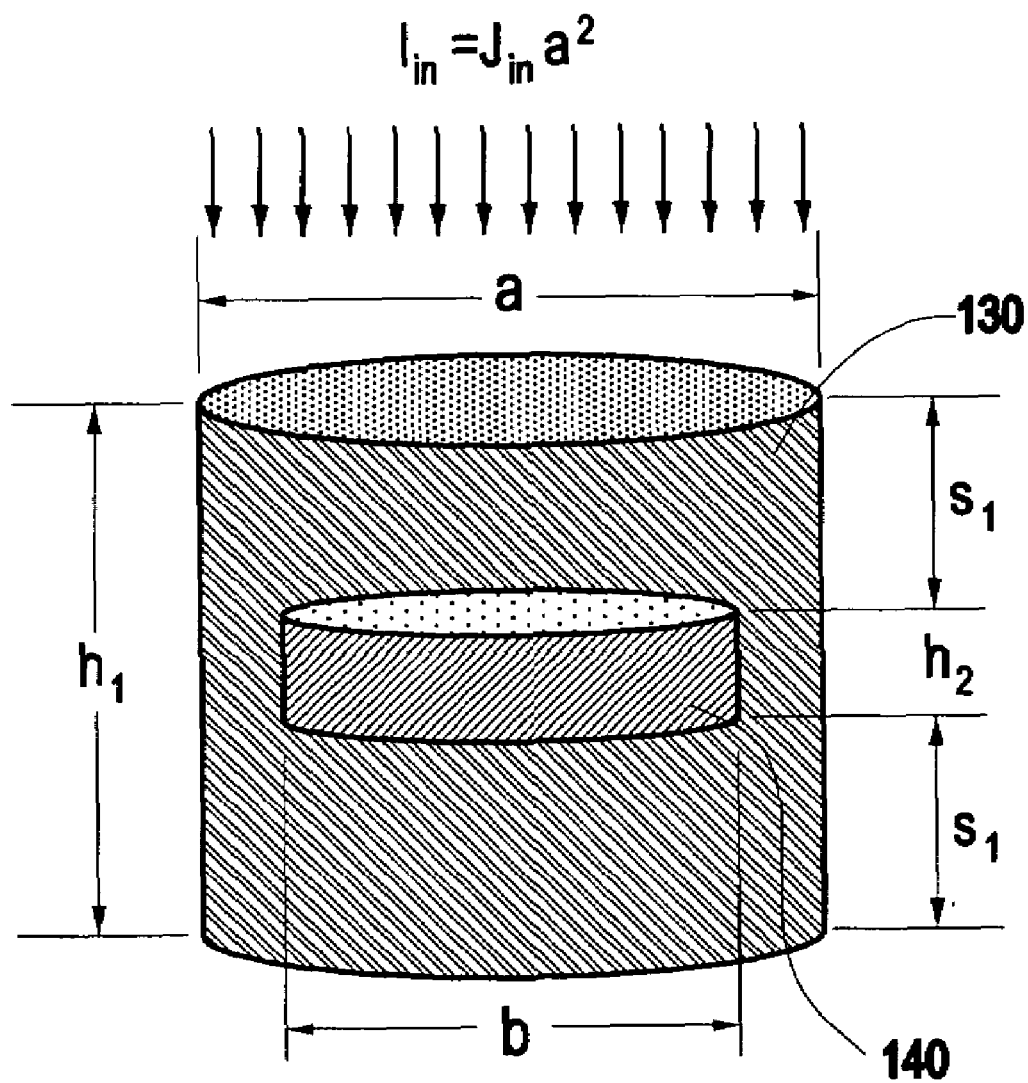
FIG. 8 provides a conceptual diagram for analyzing the heat transfer characteristics of a heating element (e.g., pillar-shaped structure), according to the exemplary aspects of the present invention.

FIG. 8 provides a conceptual diagram for analyzing the heat transfer characteristics of a heating element (e.g., pillar-shaped structure 130) according to the exemplary aspects of the present invention.

Specifically, for purposes of analysis, assuming that the phase-change element 140 and the pillar-shaped structure 130 may be viewed as a cylinder-inside-a-cylinder (e.g., concentric cylinders), the following equations (1)–(3) approximately describes the time dependence of the memory element's temperature T(t), with $$T(t)=T_{final}+(T_0-T_{final})\exp(-t/\tau_0) \qquad \text{Eq. (1)}$$

where $$\tau_0=(s_1 b^2 h_2 c_v)/(2\Gamma_K a^2) \qquad \text{Eq. (2)}$$

$$T_{final}-T_0=(s_1/(2\sigma_K a^2))P_{in}=J_{in}^2 \rho h_2(a^4/(a^2-b^2)) \qquad \text{Eq. (3)}$$

where it is assumed that the top and bottom of the large cylinder 130 (e.g., corresponding to the pillar-shaped structure) are anchored to a thermal bath at temperature $T_0$, and has an electrical resistivity $\rho$ and thermal conductivity $\sigma K$, and that the smaller cylinder 140 (e.g., corresponding to the phase-change element 140) has an electrical resistivity $\rho_c \gg \rho$ and thermal conductivity $\sigma_{a,b} \sim \sigma_K$ and heat-capacity $c_v$ and the small cylinder 140 can be treated as an averaged volume of constant temperature T.

Thus, where $a=0.1\ \mu m$, $b=0.095\ \mu m$, $s_1=h_2=200\ \text{Å}$, $\sigma_K=14\ mW/cm\text{-}K$, $\rho=0.75\ m\Omega\text{-}cm$ (as for example for $CeFe_4Sb_{12}$), under a current of $I_{in}=J_{in}a^2 \sim 2\ mA$, the result is $T_{final} \sim 440\ K+T_0$. Therefore, it may be concluded that there exist materials such that the design should be able to provide over 400 K of temperature swing at 2 mA.

It should be noted that stencil-based method described herein provides the advantage that neither the phase-change material nor the pillar-shaped structure needs to be subtractively patterned, making processing less of a challenge. In addition, the choice for wall thickness (e.g., (a–b)/2) may be relaxed if the lead material (e.g., the second conductive material in the pillar-shaped structure) has a higher electrical resistivity.

With its unique and novel features, the present invention provides a memory cell and method of fabricating the memory cell which may improve device yield and reliability, and (e.g., at the same time) eliminate the need to individually break-in each phase-change element for reproducible operation.

While the invention has been described in terms of one or more ememplary embodiments, those skilled in the art will recognize that the invention can be practiced with modification within the spirit and scope of the appended claims. Specifically, one of ordinary skill in the art will understand that the drawings herein are meant to be illustrative, and the design of the inventive assembly is not limited to that disclosed herein but may be modified within the spirit and scope of the present invention.

Further, Applicant's intent is to encompass the equivalents of all claim elements, and no amendment to any claim in the present application should be construed as a disclaimer of any interest in or right to an equivalent of any element or feature of the amended claim.

What is claimed is:

1. A memory cell, comprising:
   an insulating layer formed on a first electrode layer, said insulating layer having a first opening;
   a stencil layer formed on said insulating layer, and having a second opening formed in an area of said first opening;
   a phase-change material layer formed on a surface of said first electrode layer in said first opening; and
   an electrically conductive layer comprising a first portion formed on said stencil layer and defining a second electrode layer, and a second portion formed on said phase-change material layer.

2. The memory cell according to claim 1, wherein said second portion of said electrically conductive layer forms a pillar structure which surrounds a sidewall of said phase-change material layer.

3. The memory cell according to claim 2, wherein a bottom of said phase-change material layer is surrounded by said first electrode layer, and a remaining portion of said phase-change material layer is surrounded by said pillar structure.

4. The memory cell according to claim 2, wherein a gap is formed between a sidewall of said pillar structure and said insulating layer to thermally isolate said pillar structure.

5. The memory cell according to claim 1, wherein said stencil layer comprises one of platinum, germanium, and silicon.

6. The memory cell according to claim 1, wherein said first electrode layer comprises a first electrically conductive material and said electrically conductive layer comprises a second electrically conductive material.

7. The memory cell according to claim 6, wherein said first electrically conductive material and said second electrically conductive material comprise different materials, such that a Schottky barrier is formed at an interface of said pillar structure and said first electrode layer.

8. The memory cell according to claim 6, wherein said phase-change material layer comprises a chalcogenide, and said second electrically conductive material is less electrically resistive than an initial as-deposited amorphous phase of said chalcogenide.

9. The memory cell according to claim 6, further comprising:
a third electrically conductive material formed on said first electrode layer in said first opening, said phase-change material layer being formed on said third electrically conductive material, such that said phase-change material layer is surrounded by said second and third electrically conductive materials.

10. The memory cell according to claim 9, wherein said second and third electrically conductive materials comprise a solid solution of $Bi_2Te_3$ and $Sb_2Te_3$.

11. The memory cell according to claim 10, wherein said solid solution comprises $Bi_9Sb_{31}Te_{60}$.

12. The memory cell according to claim 7, wherein a temperature change of said phase-change material layer causes a change in a threshold voltage of said Schottky barrier, and
wherein said change in said threshold voltage is used to read out the phase of the phase-change material.

13. The memory cell according to claim 1, wherein said phase-change material layer comprises a plurality of phase-change material layers formed in a multi-layer stack.

14. The memory cell according to claim 13, wherein said plurality of phase-change material layers have different phase transition temperatures.

15. The memory cell according to claim 13, wherein said multilayer stack further comprises at least one barrier layer formed between said plurality of phase-change material layers.

* * * * *